(12) United States Patent
Yang et al.

(10) Patent No.: US 8,168,505 B2
(45) Date of Patent: May 1, 2012

(54) METHOD OF FABRICATING TRANSISTOR WITH EPITAXIAL LAYERS HAVING DIFFERENT GERMANIUM CONCENTRATIONS

(75) Inventors: Cheol Hoon Yang, Gyeonggi-Do (KR); Yong Han Jeon, Gyeonggi-Do (KR)

(73) Assignee: Jusung Engineering Co., Ltd., Gwangju-si, Gyeonggi-do (KR)

( * ) Notice: Subject to any disclaimer, the term of this patent is extended or adjusted under 35 U.S.C. 154(b) by 0 days.

(21) Appl. No.: 13/107,789

(22) Filed: May 13, 2011

(65) Prior Publication Data

US 2011/0212604 A1    Sep. 1, 2011

Related U.S. Application Data

(62) Division of application No. 12/259,081, filed on Oct. 27, 2008, now Pat. No. 7,943,969.

(30) Foreign Application Priority Data

Oct. 31, 2007  (KR) .......................... 10-2007-0109926

(51) Int. Cl.
*H01L 21/331*  (2006.01)
*H01L 27/148*  (2006.01)

(52) U.S. Cl. ................ 438/350; 438/369; 438/E27.061; 438/E21.182; 438/E21.619; 257/219

(58) Field of Classification Search .................. None
See application file for complete search history.

(56) References Cited

U.S. PATENT DOCUMENTS

| | | |
|---|---|---|
| 2008/0054347 A1 | 3/2008 | Wang |
| 2008/0157119 A1 | 7/2008 | Tsai |
| 2009/0075029 A1 | 3/2009 | Thomas et al. |

*Primary Examiner* — Alonzo Chambliss
(74) *Attorney, Agent, or Firm* — Portland IP Law LLC

(57) ABSTRACT

A method of fabricating a transistor is provided. The transistor includes a SiGe epitaxial layer formed in a recess region of a substrate at both side of a gate electrode and a SiGe capping layer formed on the SiGe epitaxial layer. The transistor further includes a SiGe seed layer formed under the SiGe epitaxial layer and a silicon capping layer formed on the SiGe capping layer.

8 Claims, 4 Drawing Sheets

METHOD OF FABRICATING TRANSISTOR WITH EPITAXIAL LAYERS HAVING DIFFERENT GERMANIUM CONCENTRATIONS

CROSS REFERENCE TO RELATED APPLICATION

This application is a Divisional Application of U.S. application Ser. No. 12/259,081, filed Oct. 27, 2008, which claims priority to Korean Patent application No. 10-2007-0109926, filed on Oct. 31, 2007 and all the benefits accruing therefrom under 35 U.S.C. 119, the contents of which are herein incorporated by reference in their entirety.

BACKGROUND

1. Field of the Invention

The present invention relates to a method of fabricating the same, and more particularly to a method of forming a transistor having a strained channel formed by epitaxially growing a semiconductor layer in source and drain regions.

2. Description of the Related Art

As a semiconductor device has been highly integrated, a gate length of a transistor is reduced and thus a channel length of the transistor also becomes smaller. As the channel length is reduced, effect of a source and a drain on electric field or electric potential in a channel region becomes significant. This phenomenon refers to as a short channel effect. Carrier mobility is reduced by the short channel effect and the performance of the transistor is deteriorated by contact parasitic resistance. Therefore, there have been various studies on methods capable of improving the performance of the transistor while reducing the gate length.

Among the methods, there is a method using a local strained effect which increases the movement of electrons or holes by generating tension or compression force in a channel region under a gate of a transistor. A representative method using the local strained effect is a method of forming tension in a channel region by changing a kind and a thickness of a layer that acts as an etch stop layer during a process of forming a contact hole in a case of an NMOS transistor, or a method of forming strain in a channel region by filling a recess region through selective epitaxial growth (SEG) with silicon germanium (SiGe) that has a large lattice constant compared to silicon having a lattice constant of 5.43 Å after recessing a source and a drain regions in a case of a PMOS transistor.

In the PMOS transistor, in order to further enhance the carrier mobility by generating larger strain, the composition of Ge in SiGe is increased to a level of, e.g., more than 20%, so that a defect such as a stacking fault may be generated in the recess region. That is, if SiGe is grown with high Ge concentration of more than 20%, as the concentration of Ge increases, a growth mode thereof tends to show an island-type growth mode (Volumer-Weber mode) or heteroepitaxial mode of layer-type and island type growth mode (Stranski-Krastanove mode) rather than a layer type growth mode (Frank-van der Merwe mode) in which the layer is epitaxially grown layer by layer. Therefore, defects such as a stacking fault are generated in an interface of the recess region and the SiGe region.

Furthermore, ion implantation and silicide processes are performed to reduce the contact resistance of the SiGe layer having high Ge concentration. However, sheet resistance is increased on the contrary. That is, at a temperature of 300 K, the electron mobility and hole mobility of Si are 1500 cm$^2$/V-s and 400 cm$^2$/V-s, respectively and those of Ge are 3900 cm$^2$/V-s and 1900 cm$^2$/V-s, respectively. Theoretically, the sheet resistance decreases as the concentration of Ge in SiGe increases. However, in practice, as the concentration of Ge increases, the sheet resistance increases since a silicide material such as Ni used as a silicide in a Ni silicide process is readily agglomerated on a surface of SiGe.

By the defect such as the stacking fault of SiGe of the source and drain regions, effect of forming a strained channel is reduced. When the sheet resistance of the silicide increases, a leakage current increases and thus increase of the carrier mobility expected by using SiGe can't be achieved. In addition, the above drawbacks deteriorate the performance of the transistor.

SUMMARY

An aspect of the present invention provides a transistor and a method of fabricating the same, capable of improving the performance by preventing increase of resistance and a stacking fault.

Another aspect of the present invention provides a transistor and a method of fabricating the same, capable of preventing a stacking fault and increase of sheet resistance after a silicide process by forming a second SiGe layer having a lower Ge concentration than that of a first SiGe layer, wherein the second SiGe layer is formed on the first SiGe layer.

Still another aspect of the present invention provides a transistor and a method of fabricating the same, capable of preventing a stacking fault and increase of sheet resistance after a silicide process by forming a SiGe seed layer and a SiGe capping layer both of which have a lower Ge concentration than that of a SiGe layer, wherein the SiGe seed layer and the SiGe capping layer are formed under and on the SiGe layer, respectively.

In accordance with an exemplary embodiment of the present invention, a transistor includes: a first epitaxial layer that contains Ge and is formed in a recess region of the substrate at both sides of the gate electrode; and a second epitaxial layer that contains Ge whose concentration is lower than that of the first epitaxial layer and is formed at least one of under and on the first epitaxial layer.

The first epitaxial layer may include a SiGe layer and the concentration of Ge of the SiGe layer may be in a range of approximately 25% to approximately 50%.

The second epitaxial layer may include a SiGe layer and the concentration of Ge of the SiGe layer may be in a range of approximately 5% to approximately 15%.

The concentration of Ge contained in the second epitaxial layer formed on the first epitaxial layer may be decreased as going from a lower portion to an upper portion.

The concentration of Ge contained in the second epitaxial layer formed under the first epitaxial layer may be increased as going from a lower portion to an upper portion.

The transistor further may include a silicide layer formed on the gate electrode, the first epitaxial layer or the second epitaxial layer that is formed on the first epitaxial layer.

The transistor may further include a silicon layer formed on the second epitaxial layer that is formed on the first epitaxial layer.

The transistor may further include a silicide layer formed on the silicon layer and the gate electrode.

In accordance with another exemplary embodiment of the present invention, a method of fabricating a transistor includes: forming a gate electrode over a given portion of a substrate; forming a recess region by etching predetermined portions of the substrate at both sides of the gate electrode;

forming a first epitaxial layer containing Ge in the recess region; and forming a second epitaxial layer whose Ge concentration is lower than that of the first epitaxial layer, wherein the second epitaxial layer is formed at least one of under and on the first epitaxial layer.

The first and the second epitaxial layers may include a SiGe layer.

The second epitaxial layer formed on the first epitaxial layer may be formed so that Ge concentration is decreased as going from a lower portion to an upper portion.

The second epitaxial layer formed under the first epitaxial layer may be formed so that Ge concentration is increased as going from a lower portion to an upper portion.

Forming the first epitaxial layer and forming the second epitaxial layer may be continuously performed.

The method further may include further forming a silicide layer on the gate electrode, the first epitaxial layer or the second epitaxial layer that is formed on the first epitaxial layer.

The method further includes forming a silicon layer on the first epitaxial layer or the second epitaxial layer.

The method further includes forming a silicide layer on the silicon layer and the gate electrode.

BRIEF DESCRIPTION OF THE DRAWINGS

The above and other features and advantages of the present invention will become more apparent by describing in detail preferred embodiments thereof with reference to the attached drawings in which.

DESCRIPTION OF THE PREFERRED EMBODIMENTS

Figure 1:
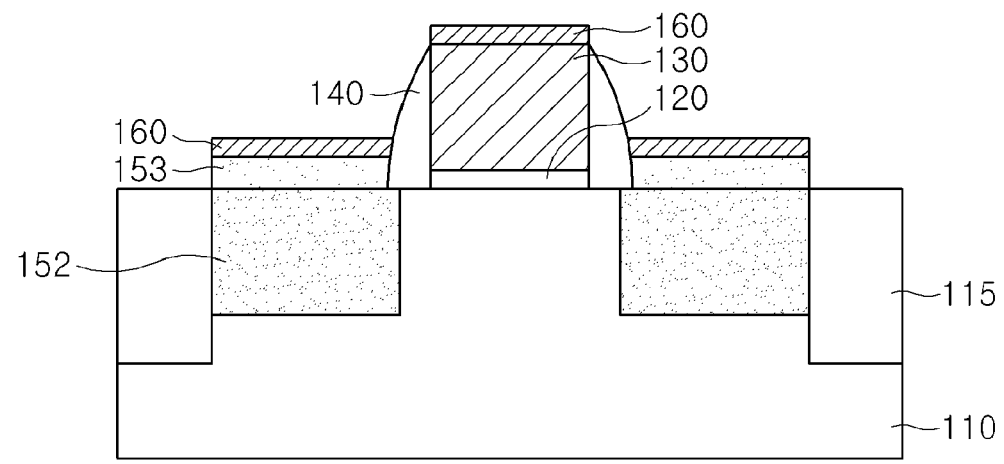
FIG. 1 is a cross-sectional view illustrating a transistor in accordance with a first embodiment of the present invention.

Hereinafter, exemplary embodiments will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the figures, the dimensions of layers and regions are exaggerated for clarity of illustration. Like reference numerals refer to like elements throughout. It will also be understood that when a layer, a film, a region or a plate is referred to as being on another one, it can be directly on the other one, or one or more intervening layers, films, regions or plates may also be present.

FIG. 1 illustrates a cross-sectional view of a transistor in accordance with a first embodiment of the present invention.

Referring to FIG. 1, the transistor includes a gate insulation layer 120 and a gate electrode 130 that are formed in a stack structure on a substrate 110, a spacer 140 formed on sidewalls of the gate electrode 130, an epitaxial layer 152 formed in a recess region of the substrate 110 at both sides of the gate electrode 130 and acting as source and drain regions, a capping layer 153 formed on the epitaxial layer 152, and a silicide layer 160 formed on the gate electrode 130 and the capping layer 153. Herein, the epitaxial layer 152 and the capping layer 153 are formed of SiGe and the concentration of Ge contained in the capping layer 153 is lower than that of Ge contained in the epitaxial layer 152. Furthermore, the concentration of Ge contained in the capping layer 153 may be gradually reduced as going from a lower portion to an upper portion. In accordance with another embodiment of the present invention, a device isolation layer 115 may be formed in the substrate 110.

The substrate 110 may include a silicon on insulation (SOI) substrate having a single crystal semiconductor layer, or a signal crystal semiconductor wafer. The single crystal semiconductor layer may be one of a single crystal silicon layer, a single crystal germanium layer, a single crystal silicon germanium layer and a single crystal silicon carbide layer. The single crystal semiconductor wafer may be one of a single crystal silicon wafer, a single crystal germanium wafer, a single crystal silicon germanium wafer and a single crystal silicon carbide wafer. Meanwhile, the device isolation layer 115 may be formed in the substrate 110 to define an active region and a field region, thereby isolating devices. The device isolation layer 115 may be formed through a shallow trench isolation (STI) process.

The gate insulation layer 120 is formed on a portion of the substrate 110 and may be formed in a single or stack structure using a silicon oxide ($SiO_2$) layer, a silicon nitride (SiNx) layer, a silicon oxynitride (SiON) layer and so on.

The gate electrode 130 is formed on the gate insulation layer 120 and may be formed in a single or stack structure using a conductive layer such as a polysilicon layer and a metal layer.

The spacer 140 is formed on the sidewalls of the gate electrode 130 and may be formed in a single or stack structure using a silicon oxide ($SiO_2$) layer, a silicon nitride (SiNx) layer, a silicon oxynitride (SiON) layer and so on.

The epitaxial layer 152 is formed in the recess region where the substrate 110 is recessed in a given depth at both sides of the gate electrode 130 and may be formed by epitaxially growing a SiGe layer. The epitaxial layer 152 contains Ge whose concentration is greater than 25% and, preferably, in a range of approximately 25% to approximately 50%. If the concentration of Ge contained in the epitaxial layer 152 is lower than 25%, it is difficult to increase the carrier mobility up to a desirable level since the channel region has small strain and an effect of the capping layer is slight. On the other hand, if the concentration of Ge is greater than 50%, Ge may be diffused in a subsequent process and thus resistance may be increased.

The capping layer 153 is formed on the epitaxial layer 152 and has the thickness less than that of the epitaxial layer 152. For example, the thickness of the capping layer 153 is in a range of approximately 5 nm to approximately 10 nm. The capping layer 153 is formed of SiGe and contains Ge whose concentration is lower than that of Ge contained in the epitaxial layer 152. The capping layer 153 contains Ge whose concentration is lower than 15% and, preferably, in a range of approximately 5% to approximately 15%. If the concentration of Ge contained in the capping layer 153 is lower than 5%, the layer 153 fails to act as a capping layer since its features becomes substantially the same as those of a Si layer. On the other hand, if the concentration of Ge is greater than 15%, the concentration is close to that of Ge contained in the epitaxial layer 152 and thus the capping layer 153 fails to act as a buffering layer. Furthermore, the capping layer 153 is formed containing Ge whose concentration may be gradually reduced as going from a lower portion being in contact with the epitaxial layer 152 to an upper portion. For instance, the concentration of Ge contained in the capping layer 153 is 15% at the lower portion and becomes 5% at the uppermost portion since the concentration of Ge is reduced as going to the upper portion of the capping layer 153.

The silicide layer 160 is formed on exposed portions of conductive layers, i.e., the gate electrode 130 and the capping layer 153, and may include a Ni layer. The Ni layer may include a pure Ni layer or a Ni alloy layer. The Ni alloy layer may contain one selected from a group consisting of tantalum (Ta), zirconium (Zr), titanium (Ti), hafnium (Hf), tungsten (W), cobalt (Co), platinum (Pt), molybdenum (Mo), palladium (Pd), vanadium (V), a niobium (Nb) and a combination thereof.

In the transistor in accordance with the first embodiment of the present invention, by growing the SiGe epitaxial layer 152 in the source and drain regions, SiGe has strain in the recess region since the lattice constants of Si and Ge are 5.43 and 5.65, respectively. This strained SiGe provides compressive strain to the channel region and thus hole mobility increases. Moreover, the increase of resistance due to the increase of the concentration of Ge contained in the epitaxial layer 152 may be prevented by growing the capping layer 153 on the epitaxial layer 152, wherein the concentration of Ge contained in the capping layer 153 is lower than that of Ge contained in the epitaxial layer 152. Therefore, the performance of the transistor can be improved by enhancing the carrier mobility using the strained channel in the PMOS transistor.

FIGS. 2 to 5 are cross-sectional views illustrating a method of fabricating the transistor in accordance with the first embodiment of the present invention described in FIG. 1.

Figure 2:
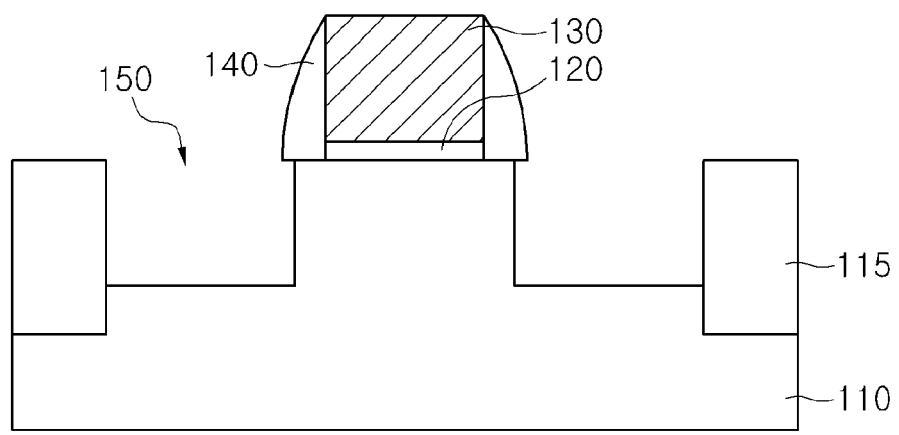
FIGS. 2 to 5 are cross-sectional views illustrating a method of fabricating the transistor in accordance with the first embodiment of the present invention described in FIG. 1.

Referring to FIG. 2, the device isolation layer 115 is formed in a portion of the substrate 110 that includes a single crystal semiconductor wafer or an SOI substrate having a single crystal semiconductor layer. The device isolation layer 115 may be formed through an STI process. The gate insulation layer 120 is formed on the substrate 110 using an insulation layer such as a silicon oxide layer, a silicon nitride layer or a silicon oxynitride layer. Then, the gate electrode 130 is made by forming a conductive layer such as a polysilicon layer or a metal layer in a single or stack structure and patterning the conductive layer. The spacer 140 is formed on the sidewalls of the gate electrode 130. The spacer 140 may be made by forming an insulation layer in a single or stack structure on an entire surface of a resultant structure including the gate electrode 130 and performing a front etch process on the insulation layer. Then a recess region 150 is formed by etching the substrate 110 at both sides of the spacer 140 in a given depth through a dry or wet etch process.

Figure 3:
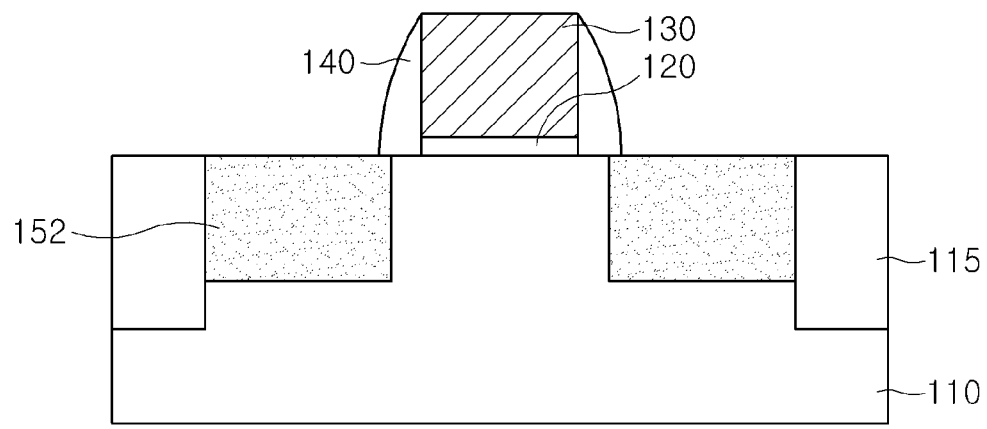

Referring to FIG. 3, native oxide or contamination materials remaining on a surface of the recess region 150 is removed by a dry cleaning or wet cleaning process. The epitaxial layer 152 is formed using a chemical vapor deposition method such as an ultra-high vacuum chemical vapor deposition (UH-VCVD) method, a remote plasma CVD (RPCVD) method, a low pressure CVD (LPCVD) method, or an atmospheric pressure CVD (APCVD) method. The epitaxial layer 152 may include a SiGe layer that is formed using a Si source gas containing $SiH_4$ or $Si_2H_6$ and a Ge source gas containing $GeH_4$. At this time, a Cl-based etch gas containing one of Cl, HCl, $SiCl_4$, $SiHCl_3$, $SiH_2Cl_2$, and a combination thereof is added to enhance the selective performance. In the epitaxial growth process, the SiGe epitaxial layer 152 is selectively formed in the recess region 150 of the substrate 110 while it is not formed on insulation layers such as the device isolation layer (not shown) and the spacer 140. Herein, the epitaxial layer 152 is formed to contain Ge having the concentration in a range of approximately 25% to approximately 50% by adjusting the inflow of the Si source gas and the Ge source gas. The epitaxial layer 152 may be grown as in-situ doping of Group III elements such as boron (B) according to a design or a kind of devices.

Figure 4:
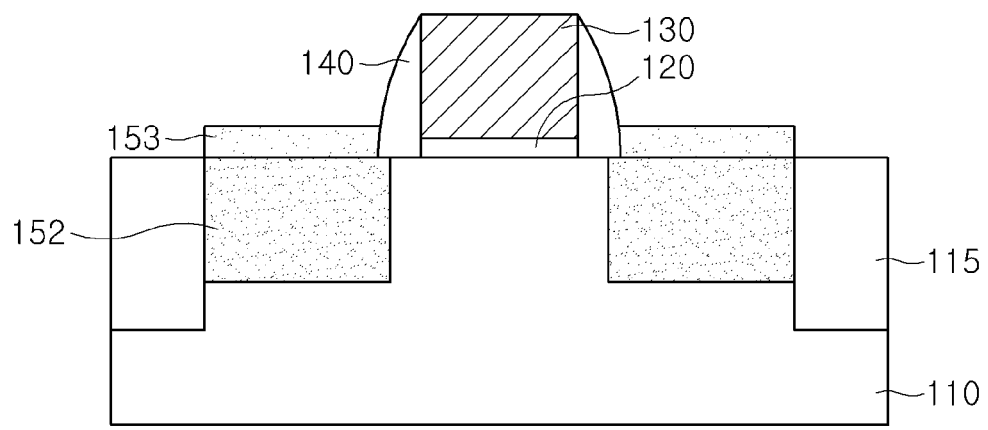

Referring to FIG. 4, the capping layer 153 is formed on the epitaxial layer 152 to have a thickness less than that of the epitaxial layer 152. The capping layer 153 is formed of SiGe like the epitaxial layer 152. That is, the capping layer 153 is formed using the Si source gas containing $SiH_4$ or $Si_2H_6$, the Ge source gas containing $GeH_4$ and the Cl-based etch gas containing one of Cl, HCl, $SiCl_4$, $SiHCl_3$, $SiH_2Cl_2$, and a combination thereof. At this time, the capping layer 153 is formed to contain Ge having the concentration lower than that of Ge contained in the epitaxial layer 152. For example, the capping layer 153 is formed to contain Ge whose concentration becomes in a range of approximately 5% to approximately 15% by adjusting the inflow of the Si source gas and the Ge source gas. The capping layer 153 may be formed in a process following the process of forming the epitaxial layer 152. Namely, the capping layer 153 may be formed by reducing the inflow of the Ge source gas after the epitaxial layer 152 is formed. In the meantime, the capping layer 153 may be formed to contain Ge whose concentration is gradually reduced as going from a lower portion being in contact with the epitaxial layer 152 to an upper portion. For instance, the concentration of Ge contained in the capping layer 153 may be 15% at the lower portion and 5% at the upper portion. In this case, the epitaxial layer 152 and the capping layer 153 may be also formed in continuous processes. That is, the capping layer 153 may be formed as reducing the inflow of the Ge source gas after the epitaxial layer 152 is formed.

Figure 5:
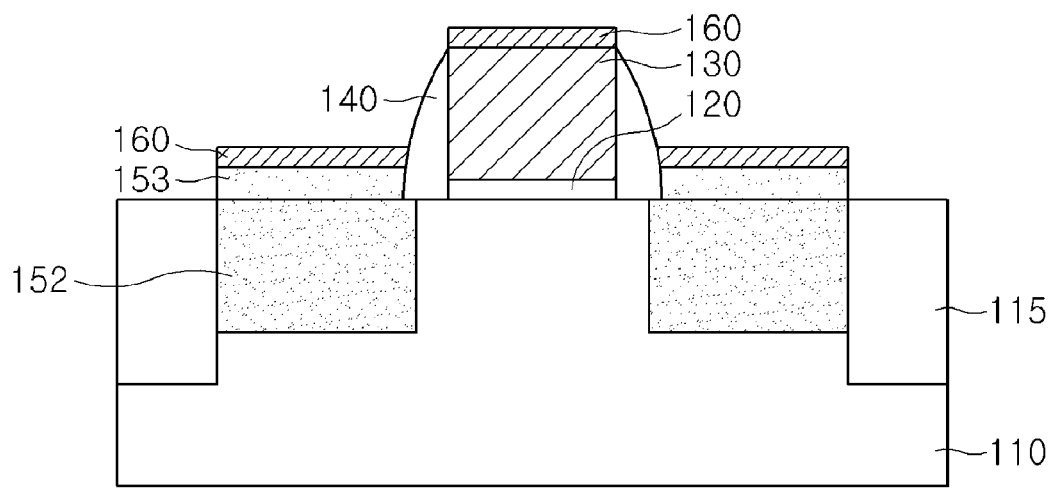

Referring to FIG. 5, the silicide layer 160 is made by forming a metal layer such as a Ni layer on an entire surface of a resultant structure including the capping layer 153, and performing a thermal treatment process on the Ni layer to allow the Ni layer to react with the capping layer 153 and the gate electrode 130. Herein, Group III elements such as B may be injected into the capping layer 153 before forming the metal layer.

Figure 6:
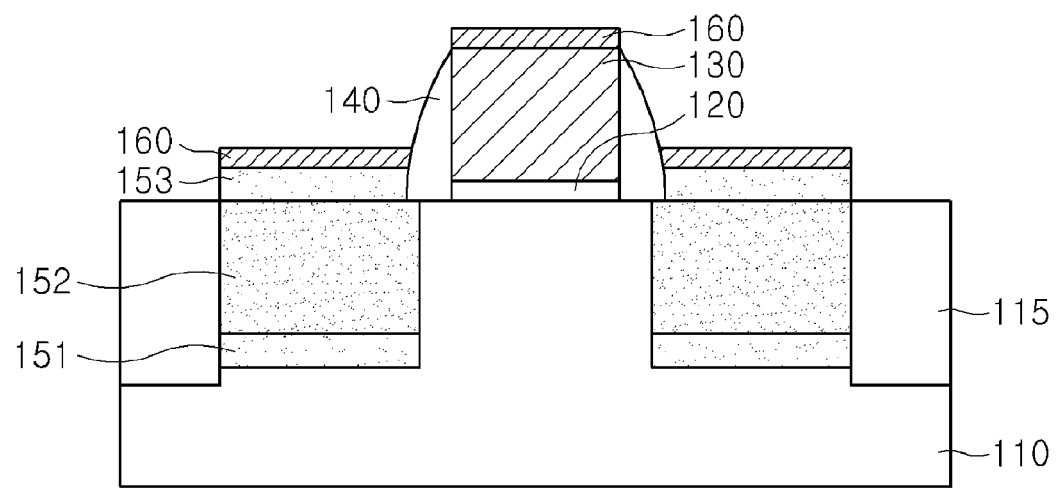
FIG. 6 is a cross-sectional view illustrating a transistor in accordance with a second embodiment of the present invention.

FIG. 6 illustrates a cross-sectional view of a transistor in accordance with a second embodiment of the present invention. By forming a seed layer including a SiGe layer that contains Ge having the concentration in a range of approximately 5% to approximately 15% before forming an epitaxial layer, it is possible to remove a stacking fault being apt to occur at a lower portion of a recess region due to the epitaxial layer containing Ge whose concentration is greater than 25%. The increase of resistance is prevented by forming a capping layer.

Referring to FIG. 6, the transistor in accordance with the second embodiment of the present invention includes a gate insulation layer 120 and a gate electrode 130 that are formed in a stack structure on a substrate 110, a spacer 140 formed on sidewalls of the gate electrode 130, a seed layer 151 and an epitaxial layer 152 formed in a recess region of the substrate 110 at both sides of the gate electrode 130, a capping layer 153 formed on the epitaxial layer 152, and a silicide layer 160 formed on the gate electrode 130 and the capping layer 153. Herein, the seed layer 151, the epitaxial layer 152 and the capping layer 153 are formed of SiGe and the concentration of Ge contained in the seed layer 151 and the capping layer 153 is lower than that of Ge contained in the epitaxial layer 152. Furthermore, the concentration of Ge contained in the capping layer 153 may be gradually reduced as going from a lower portion to an upper portion. The concentration of Ge contained in the seed layer 151 may be gradually increased as going from a lower portion to an upper portion.

The seed layer 151 is formed to have a given thickness of approximately 5 nm to approximately 10 nm in the recess region where the substrate 110 is recessed in a given depth at both sides of the gate electrode 130, and may be formed by epitaxially growing a SiGe layer. The seed layer 151 may contain Ge whose concentration is lower than 15% and, preferably, in a range of approximately 5% to approximately 15%. Furthermore, the seed layer 151 may be formed to contain Ge whose concentration is gradually increased as going from a lower portion to an upper portion. For instance, the concentration of Ge contained in the seed layer 151 may be 5% at the lower portion and may become 15% at the uppermost portion as the concentration of Ge is gradually increased as going to the upper portion.

The epitaxial layer 152 is formed by epitaxially growing a SiGe layer on the seed layer 151. The epitaxial layer 152 may be formed to contain Ge whose concentration is greater than 25% and, preferably, in a range of approximately 25% to approximately 50%.

The capping layer 153 is formed on the epitaxial layer 152 and has the thickness less than that of the epitaxial layer 152. For example, the thickness of the capping layer 153 is in a range of approximately 5 nm to approximately 10 nm. The capping layer 153 is formed of SiGe and contains Ge having the concentration lower than that of Ge contained in the epitaxial layer 152. The capping layer 153 contains Ge whose concentration is lower than 15% and, preferably, in a range of approximately 5% to approximately 15%. Furthermore, the capping layer 153 may be formed to contain Ge whose concentration is gradually reduced as going from a lower portion being in contact with the epitaxial layer 152 to an upper portion. For instance, the concentration of Ge contained in the capping layer 153 is 15% at the lower portion and becomes 5% at the uppermost portion since the concentration of Ge is reduced as going to the upper portion.

A method of forming the transistor in accordance with the second embodiment follows the processes of fabricating the transistor in accordance with the first embodiment described in FIGS. 1 and 2A to 2D. Unlike the first embodiment, the transistor in accordance with the second embodiment includes the seed layer 151 formed before the epitaxial layer 152 is formed, wherein the seed layer 151 is formed of SiGe that contains Ge having the concentration in a range of approximately 5% to approximately 15% or of SiGe that contains Ge whose concentration is gradually increased as going from a lower portion to an upper portion. Therefore, the seed layer 151, the epitaxial layer 152 and the capping layer 153 may be formed in continuous processes. In one embodiment, the seed layer 151 is firstly formed to contain Ge whose concentration is lower than 15% by supplying a Si source gas, a Ge source gas and an etch gas; subsequently, the epitaxial layer 152 is formed to contain Ge whose concentration is greater than 25% by reducing the inflow of the Si source gas and increasing the inflow of the Ge source gas; and, finally, the capping layer 153 is formed to contain Ge whose concentration is lower than 15% by increasing the inflow of the Si source gas again and reducing the inflow of the Ge source gas. In another embodiment, the seed layer 151 is formed to contain Ge whose concentration is increasing from 5% to 15% by reducing the inflow of the Si source gas and increasing the inflow of the Ge source gas; then the epitaxial layer 152 is formed to contain Ge whose concentration is greater than 25% by reducing the inflow of the Si source gas and increasing the inflow of the Ge source gas; and, finally, the capping layer 153 is formed to contain Ge whose concentration is decreasing from 15% to 5% by increasing the inflow of the Si source gas again and reducing the inflow of the Ge source gas. In still another embodiment, the seed layer 151 is formed to contain Ge whose concentration is gradually increasing from 5% to 15% and the capping layer 153 contains Ge whose concentration is fixed to 15%. In further still another embodiment, the seed layer 151 contains Ge whose concentration is fixed to 15% and the capping layer 153 is formed to contain Ge whose concentration is gradually decreasing from 15% to 5%.

Figure 7:
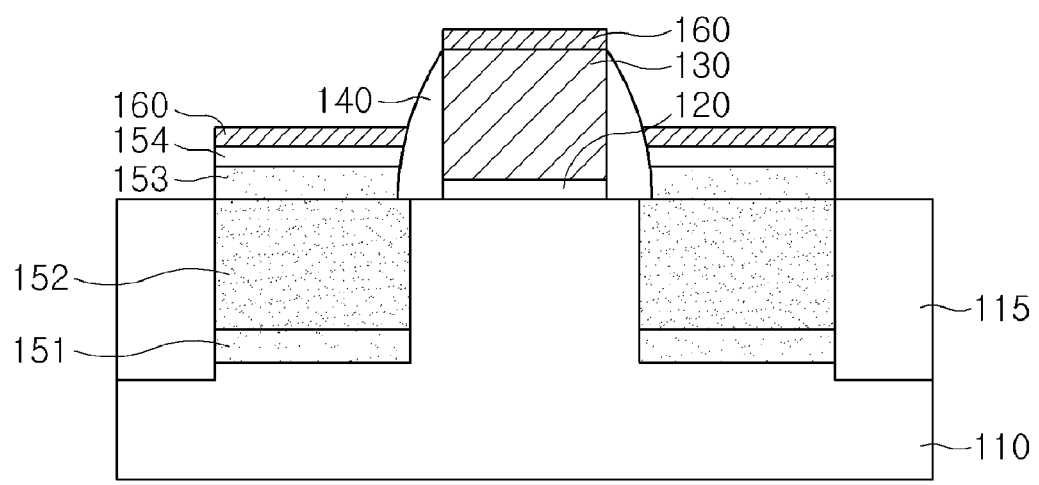
FIG. 7 is a cross-sectional view illustrating a transistor in accordance with a third embodiment of the present invention.

FIG. 7 illustrates a cross-sectional view of a transistor in accordance with a third embodiment of the present invention.

Referring to FIG. 7, the transistor includes a gate insulation layer 120 and a gate electrode 130 that are formed in a stack structure on a substrate 110, a spacer 140 formed on sidewalls of the gate electrode 130, a seed layer 151 and an epitaxial layer 152 formed in a recess region of the substrate 110 at both sides of the gate electrode 130, a first and a second capping layer 153 and 154 formed on the epitaxial layer 152, and a silicide layer 160 formed on the gate electrode 130 and the second capping layer 154. Herein, the seed layer 151, the epitaxial layer 152 and the first capping layer 153 are formed of SiGe and the concentration of Ge contained in the seed layer 151 and the first capping layer 153 is lower than that of Ge contained in the epitaxial layer 152. Furthermore, the concentration of Ge contained in the first capping layer 153 may be gradually reduced as going from a lower portion to an upper portion. The concentration of Ge contained in the seed layer 151 may be gradually increased as going from a lower portion to an upper portion. The second capping layer 154 is formed using a silicon layer and has a thickness equal to or less than that of the first capping layer 153.

As described above, when forming the second capping layer 154 formed of silicon on the first capping layer 153 formed of SiGe, the resistance of the source and drain regions may be further reduced by the second capping layer 154. In this case, a region under the gate electrode 130 between the epitaxial layers 152 having Ge concentration that is greater than 25% becomes a strained channel region.

Meanwhile, the embodiments prevent the increase of resistance by forming the capping layer 153 on the epitaxial layer 152, prevent the stacking fault and the increase of resistance by respectively forming the seed layer 151 and the capping layer 153 under and on the epitaxial layer 151, and further prevent the increase of resistance by forming the silicon capping layer 154 on the capping layer 153. Meanwhile, only the seed layer 151 under the epitaxial layer 152 may be formed, which can prevent the stacking fault as well as the increase of resistance. That is, by preventing the stacking fault of the epitaxial layer 152 through the forming of the seed layer 151, Ge is completely combined in the epitaxial layer 152 and thus it is possible to prevent the agglomeration of Ge on the surface of the epitaxial layer 152 from occurring in a subsequent silicide process.

In accordance with the exemplary embodiments of the present invention, the SiGe epitaxial layer having high Ge concentration forms compressive strain in the channel region under a gate to thereby improve the carrier mobility and the SiGe seed layer having low Ge concentration formed under the SiGe epitaxial layer can prevent generation of the stacking fault in the recess region. And, by forming the SiGe capping layer having low Ge concentration on the SiGe epitaxial layer, it is possible to prevent the increase of resistance from occurring as the Ge concentration of the epitaxial layer is increased. Moreover, by forming the silicon capping layer on the SiGe capping layer, the resistance can be further reduced.

As a result, high-density and high integration can be accomplished by increasing the carrier mobility of the PMOS transistor employing the strained channel, which improves the overall performance of CMOS devices.

Although the present invention has been described with reference to the exemplary embodiments, the present invention is not limited thereto. Therefore, it will be readily understood by those skilled in the art that various modifications and changes can be made thereto without departing from the spirit and scope of the present invention defined by the appended claims.

What is claimed is:

1. A method of forming a transistor, the method comprising:
   forming a gate electrode over a substrate;
   forming a seed layer that contains Ge in a recess region of the substrate at both sides of the gate electrode;
   forming an epitaxial layer that has a higher Ge concentration than the seed layer on the seed layer in the recess region; and
   forming a capping layer that has lower Ge concentration than the epitaxial layer on the epitaxial layer.

2. The method of claim 1, wherein the epitaxial layer comprises a SiGe layer and the concentration of Ge of the SiGe layer is in a range of approximately 25% to approximately 50%.

3. The method of claim 1, wherein the seed layer and the capping layer comprise a SiGe layer and the concentration of Ge of the SiGe layer is in a range of approximately 5% to approximately 15%.

4. The method of claim 3 wherein the concentration of Ge contained in the capping layer is decreased from a lower portion to an upper portion.

5. The method of claim 3, wherein the concentration of Ge contained in the seed layer is increased from a lower portion to an upper portion thereof.

6. The method of claim 1, further comprising a silicon layer formed on the capping layer.

7. The transistor of claim 1, wherein the epitaxial layer is formed through in-situ doping of Group III element.

8. The method of claim 1, which further comprises forming a silicide layer on the gate electrode and on the capping layer.

* * * * *